United States Patent [19]

Radigan

[11] Patent Number: 4,732,841
[45] Date of Patent: Mar. 22, 1988

[54] TRI-LEVEL RESIST PROCESS FOR FINE RESOLUTION PHOTOLITHOGRAPHY

[75] Inventor: Kenneth J. Radigan, Los Gatos, Calif.

[73] Assignee: Fairchild Semiconductor Corporation, Cupertino, Calif.

[21] Appl. No.: 843,340

[22] Filed: Mar. 24, 1986

[51] Int. Cl.$^4$ .............................................. G03F 7/26
[52] U.S. Cl. ..................................... 430/311; 430/312; 430/313; 430/314; 430/323; 430/324; 430/325; 430/322
[58] Field of Search ................. 430/311, 312, 313, 314, 430/323, 324, 325, 322

[56] References Cited

U.S. PATENT DOCUMENTS

| | | | |
|---|---|---|---|
| 3,969,543 | 7/1976 | Roberts et al. | |
| 4,004,044 | 1/1977 | France et al. | 427/43.1 |
| 4,041,190 | 8/1977 | Dubois et al. | |
| 4,202,914 | 5/1980 | Hauas et al. | 427/38 |
| 4,222,792 | 9/1980 | Lever et al. | |
| 4,253,888 | 3/1981 | Kikuchi | 430/330 |
| 4,507,384 | 3/1985 | Morita et al. | |
| 4,524,121 | 6/1985 | Gleim et al. | 430/176 |
| 4,599,243 | 7/1986 | Sachdev et al. | 430/314 |

FOREIGN PATENT DOCUMENTS

| | | |
|---|---|---|
| 50-15663 | 2/1975 | Japan . |
| 57-168247 | 10/1982 | Japan . |
| 58-162041 | 9/1983 | Japan . |
| 59-048929 | 3/1984 | Japan . |
| 59-161827 | 9/1984 | Japan . |
| 60-035727 | 2/1985 | Japan . |
| 60-075320 | 4/1985 | Japan . |
| 60-057833 | 4/1985 | Japan . |
| 60-108842 | 6/1985 | Japan . |

OTHER PUBLICATIONS

Fried, L. J., et al., *IBM J. Res. Dev.*, vol. 26, No. 3, pp. 362-371, 5/1982.
P. Burggraaf, "Multilayer Resist Processing Update", *Semiconductor International* (Aug. 1985), pp. 88-92.
N. J. Chou et al., "Mechanism of Oxygen Plasma Etching of Polydimethyl Siloxane Films," *Appl. Phys. Lett.* (Jan. 1985), 46(1):31-33.
E. D. Roberts, "Improvements to the Dry-Etch Resistance of Sensitive Positive-Working Electron Resists," Proc. SPIE-Int. *Soc. Opt. Eng.* (1985), 539:124-130.
V. S. Nguyen et al., "Plasma Deposited Organosilicon Polymers—Deposition, Characterization, and Application in Multi-Layer Resist," *Proc.-Electrochem. Soc.* (1985), 85-1:299-316.
J. Paraszczak et al., "Multilayer Resist Systems Using Polysiloxanes as Etch Masks," *Proc. SPIE-Int. Soc. Opt. Eng.* (1983), 393:8-19.
K. G. Sachdev, "Characterization of Plasma-Deposited Organosilicon Thin Films," *Thin Solid Films* (1983), 107(3):24-50.
"SR 80M Silicone Electrical Resin," General Electric Rubber and Fluid Products Dept., Preliminary Product Profile, undated.
"SR 80M Silicone Mica Bonding and Moisture Resistant Varnish," General Electric, *Silicone Product Data*, Product Data Sheet, Jul. 1985.
"Improved Photoresists for Integrated Circuit Chips Devised," *Chemical & Engineering News* (Oct. 7, 1985), pp. 27-30.

*Primary Examiner*—Charles L. Bowers, Jr.
*Attorney, Agent, or Firm*—Stephen J. Phillips; David H. Carroll; James M. Heslin

[57] ABSTRACT

A multilayer photoresist system for defining very small features on a semiconductor substrate relies on forming a planarization layer directly over the substrate. An image transfer layer is formed over the planarization layer, and a photoresist imaging layer formed over the image transfer layer. The image transfer layer comprises an organic or inorganic resin which has been cured in a non-oxidated plasma. It has been found that such a curing technique provides a particularly smooth and defect-free image transfer layer. Very thin photoresist imaging layers may thus be formed over the image transfer layer, allowing very high lithographic resolution in the imaging layer. The resulting high resolution openings may then be transferred downward to the image transfer layer and planarization layer by etching, allowing the formation of very small geometries on the substrate surface.

10 Claims, 6 Drawing Figures

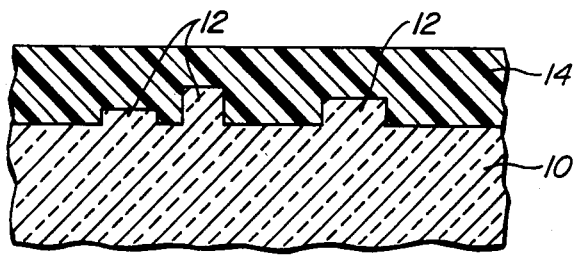
FIG._1.
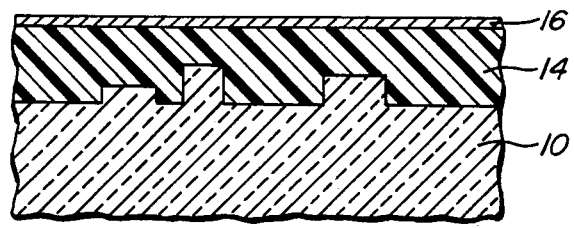
FIG._2.
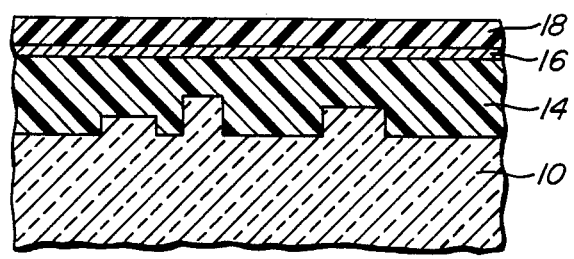
FIG._3.
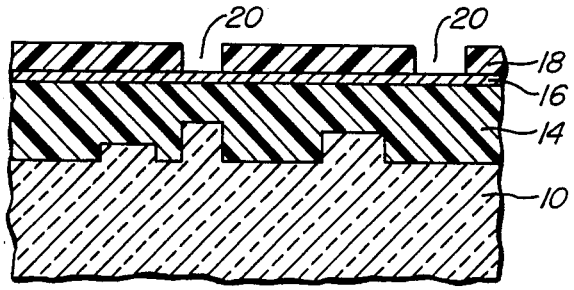
FIG._4.

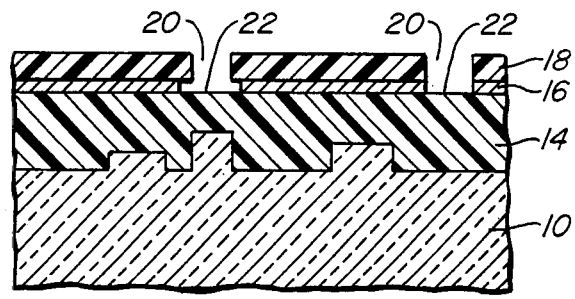
FIG._5.
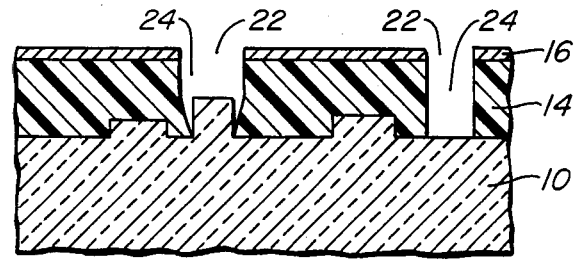
FIG._6.

TRI-LEVEL RESIST PROCESS FOR FINE RESOLUTION PHOTOLITHOGRAPHY

BACKGROUND OF THE INVENTION

1. Field of the Invention

The present invention relates generally to photolithographic techniques for forming features in and on semiconductor substrates, and more particularly to a tri-level photolithographic technique for forming regions and structures having very fine geometries, such as very narrow metal lines, on such semiconductor substrates.

The ability to resolve very small features on semiconductor substrates is of increasing importance as more and more devices are placed on individual chips at increasing densities. The use of single-layer photoresist systems to define such small features is often limited since the photoresist must be made relatively thick in order to adequately cover a substrate having an uneven topography. Such thick photoresist layers defy the precise imaging necessary to define very small features because the focus of the exposing radiation will change over the depth of the film. Moreover, radiation that adequately exposes the lower portions of the photoresist may overexpose higher regions formed on top of raised substrate features.

The use of multilayer photoresist systems partially overcomes these problems. A relatively thick layer of an organic polymer (usually referred to as a planarizing or leveling layer) applied over the substrate provides a relatively flat surface. A barrier or image transfer layer is applied over the planarizing layer, followed by an imaging layer over the image transfer layer. The imaging layer is a thin photoresist film which can be imaged to a very high resolution since it avoids the problems associated with uneven exposure and variations in the depth of focus. The pattern is then etched onto the image transfer layer, which may be an oxide, nitride, or organic or inorganic polymer, using the patterned photoresist as a mask. The pattern is ultimately transferred to the planarizing layer by conventional techniques, and the planarizing layer used as a mask for forming the desired features in or on the substrate.

While a substantial improvement over single layer photoresist systems, such tri-level resist systems have not achieved the high level resolution, usually below 1 micron, required for many modern VLSI devices. As recognized by the inventor herein, characteristics of the surface of the image transfer layer render it difficult to apply photoresist imaging layers having a thickness below about 1 micron. As the resolution achieved with a photoresist imaging layer is approximately equal to the thickness of the layer, it can be seen that resolution below 1 micron is not readily achieved.

For these reasons, it would be desirable to provide multilayer photoresist imaging systems capable of providing photolithographic imaging resolutions well below 1 micron. In particular, it would be desirable to provide an improved tri-level photoresist process having an image transfer layer which is sufficiently smooth and free of defects so that very thin imaging layers may be applied thereover.

2. Description of the Background Art

The use of multilayer photoresist imaging systems is described generally in Burgraff, "Multilayer Resist Processing Update," Semiconductor International, August, 1985, pp. 88–92 and "Improved Photoresists for Integrated Circuits Chips Devised," Chemical & Engineering News, Oct. 7, 1985, pp. 27–30.

Tri-level photoresist systems employing a polydimethylsiloxane resin material as the image transfer layer are described in U.S. Pat. No. 4,004,044 and Fried et al. IBM J. Res. Develop. 26:362–371. A similar tri-level photoresist process is described in U.S. Pat. No. 4,493,855, where a siloxane image transfer layer is deposited by plasma polymerization, followed by oven curing. Chou et al. (1985) Appl. Phys. Lett. 46:31–33, describes etching of polysiloxane films in an oxygen plasma.

SUMMARY OF THE INVENTION

The present invention provides an improved multilayer photoresist process for defining very small features, such as very fine metallization lines, on semiconductor substrates. The method is particularly effective in defining such features on substrates having an irregular surface rendering high resolution photolithography difficult.

According to the present invention, a planarizing layer is formed on the substrate to a thickness sufficient to level or planarize the topographic features on the substrate. A relatively thin image transfer layer is next applied over the planarizing layer to isolate the planarizing layer from an imaging layer to be subsequently applied. The image transfer layer is a silicone resin cured in a non-oxidizing plasma. It has been found by the inventor herein that such a curing procedure provides a particularly smooth image transfer layer which is substantially free from defects and discontinuities which have heretofore limited the ability to apply very thin imaging layers in prior tri-level resist processes. Using the process of the present invention, an imaging layer having a thickness on the order of 0.3 $\mu$m and smaller may be achieved, allowing the formation of features on the order of 0.3 $\mu$m and smaller on the surface of the semiconductor substrate.

The imaging layer is a conventional photoresist patterned by conventional lithographic techniques, and the underlying image transfer layer is patterned using the imaging layer as a mask. The image transfer layer then serves as a mask in patterning the planarizing layer, and the metallization lines or other features may then be formed on the substrate by well known techniques.

BRIEF DESCRIPTION OF THE DRAWINGS

FIG. 1 illustrates a conventional semiconductor substrate having a planarizing layer formed over its upper surface.

FIG. 2 shows the structure of FIG. 1, further including the image transfer layer formed over the upper surface of the planarizing layer.

FIG. 3 shows the structure of FIG. 2, with the imaging layer formed over the image transfer layer.

FIG. 4 shows the structure of FIG. 3, with the imaging layer having been patterned.

FIG. 5 shows the structure of FIG. 4, with the image transfer layer patterned.

FIG. 6 shows the structure of FIG. 5, with the imaging layer removed, and the planarizing layer patterned.

DESCRIPTION OF THE PREFERRED EMBODIMENTS

Referring generally to FIGS. 1–7, a specific method will be described for fabricating semiconductor devices according to the method of the present invention. Semiconductor devices are fabricated on silicon wafer substrates 10 (a portion of one being illustrated in FIGS. 1-6). Usually, the wafer will include a variety of topographic features 12 formed on its upper surface. Such features may result from previous metallization, oxide formation, etching processes, deposition processes, or the like.

Referring in particular to FIG. 1, a planarization layer 14 is formed directly over the upper surface of the substrate 10. Conveniently, the planarization layer is formed by spinning a liquid resin to a thickness sufficient to planarize or smooth over the irregularities 12. The resulting upper surface of the planarization layer 14 will thus be substantially flat and smooth. Suitable organic polymeric resins for use as the planarization layer will be thermally stable and amenable to etching, particularly reactive ion etching, which will be used to pattern the planarization layer, as described hereinafter. A variety of resins may be used, including photoresists, polyimides, polymethacrylates, and the like. After application, the organic resins will be cured by baking at an elevated temperature, typically in the range from about 200° to 225° C., for a time sufficient to fully cure the resin, typically on the order of 1 hour. Alternatively, the organic resins may be cured by exposure to a radiant heat source for a shorter period, typically 2 to 3 minutes. The resulting thickness of the resin will generally be in the range from about 1 to 5 $\mu$m.

Referring now to FIG. 2, an image transfer layer 16 is applied directly over the planarization layer 14. The image transfer layer serves to isolate the planarization layer from a subsequently applied imaging layer, as will be described hereinafter. In order to apply a very thin imaging layer over the image transfer layer, it is necessary that the image transfer layer be formed as smooth and free from surface defects as possible. It has been found that the curing of an inorganic layer in a non-oxidizing plasma achieves the desired result. Suitable inorganic layers include curable silicone resins including both linear and cross-linked polydialkylsiloxanes. One suitable silicone resin is SR 80M Silicone Electrical Resin available from General Electric Company, Silicone Products Division, Waterford, New York 12188.

The silicone resin is applied by spinning to a desired thickness, typically in the range from about 0.05 to about 0.5 $\mu$m, more typically about 0.1 $\mu$m, and by curing in a non-oxidizing plasma for from about 5 to 30 minutes, more usually about 10 to 15 minutes. The curing may be effected in a conventional barrel-type plasma reactor, and suitable non-oxidizing plasmas include nitrogen, argon, helium, and the like, particularly nitrogen. A reactor power setting of about 100 to 500 watts, more usually about 300 watts, and a pressure of about from 1 to 5 Torr, more usually about 2 Torr, is sufficient.

It has been found that such a plasma-cured silicone resin results in a highly stable glass surface composed primarily of silicon and oxygen, without residual carbon.

Optionally, an anti-reflective dye, such as a blocking dye or coumarin, may be incorporated in either the planarizing layer or the image transfer layer to further improve resolution in the overlying imaging layer. The dye is frequency selective, and chosen to allow passage of the alignment radiation, but not to reflect back the wavelength which exposes the overlying masking layer. Suitable dyes are available from Brewer Science, Inc. Rolla, Missouri, and Eastman Kodak Company, Rochester, New York.

Referring now to FIG. 3, imaging layer 18 is applied directly over the image transfer layer 16 by conventional techniques. The imaging layer 18 will be a photoresist, usually a positive photoresist, and will be applied by well known spin application techniques. The thickness of the imaging layer 18 will be as thin as possible while providing a uniform coating which is free from discontinuities. With the use of the smooth, defect-free image transfer layer of the present invention, it has been found that imaging layers having a thickness on the order of from about 0.1 to 0.5 $\mu$m, usually about 0.3 $\mu$m may be achieved. With prior art tri-level processing techniques, thicknesses below about 1 mm have been difficult to achieve. Thus, the present invention provides very high image resolution which has not previously been available with methods of this type.

Referring now to FIGS. 4-6, openings 20 are formed in the imaging layer 18 by conventional photolithographic techniques, with the image transfer layer 16 acting as a barrier to protect the underlying planarizing layer. Next, openings 22 are formed in the image transfer layer 16, typically by reactive ion etching, using the openings 20 in masking layer 18 as a mask. The openings 22 in image transfer layer 16, in turn, are used as a mask in forming openings 24 in the planarization layer 14 (FIG. 6). Once formed, the openings 24 may be utilized for a variety of conventional substrate processing steps, such as deposition, implantation, etching, and the like. The method is particularly suitable for the formation of submicron geometries on the substrate.

In a particular embodiment, a heated, ultrasonically excited organic base may be used as a stripping agent for both the image transfer layer 16 and planarizing layer 14. The base dissolves the planarizing layer 14, which is an organic polymer, and neutralizes acid etch residues which may be present after plasma etching of aluminum. The ultrasonic energy serves to break up the glass-like image transfer layer 16, while the base is able to sequester the resulting glass-like particles preventing them from redepositing on the wafer substrate 10. Preferred is the use of an ethanolamine solvent, such as R-10 available from KTI Chemicals, Inc., Sunnyvale, California.

Although the foregoing invention has been described in some detail by way of illustration and example for purposes of clarity of understanding, it will be obvious that certain changes and modifications may be practiced within the scope of the appended claims.

What is claimed is:

1. A method for defining very small features on a semiconductor substrate, said method comprising:
    forming a planarizing layer on the substrate to a thickness sufficient to planarize topographic features on the substrate;
    forming an image transfer layer over the planarizing layer, by applying a curable liquid silicone resin over the substrate;
    curing the image transfer layer in a non-oxidizing plasma;
    forming an imaging layer over the cured image transfer layer, said layer being a photoresist and having a thickness below 0.5 $\mu$m;
    patterning the imaging layer by photolithography;
    transferring the pattern in the imaging layer to the image transfer layer;

transferring the pattern in the image transfer layer to the planarizing layer; and defining features on the substrate based on the pattern in the planarizing layer.

2. A method as in claim 1, wherein the planarizing layer is an oven-cured organic resin applied by spinning.

3. A method as in claim 2, wherein the organic resin is a positive photoresist.

4. A method as in claim 1, wherein the silicone resin is a linear or cross-linked polydialkylsiloxane.

5. A method as in claim 1, wherein the image transfer layer is cured in a barrel-type plasma reactor at a pressure below about 5 Torr.

6. A method as in claim 5, wherein the non-oxidizing plasma is selected from the group consisting of nitrogen, argon, and helium plasmas.

7. A method as in claim 1, wherein the imaging layer is a positive photoresist.

8. A method as in claim 1, wherein the features formed on the substrate are metallization lines.

9. A method as in claim 1, wherein the metallization lines have a width below about 1 $\mu$m.

10. A method as in claim 1, wherein the silicone resin is applied as a liquid by spinning.

* * * * *